United States Patent
Zhou

(10) Patent No.: US 11,417,861 B2
(45) Date of Patent: Aug. 16, 2022

(54) FLEXIBLE DISPLAY PANEL AND PREPARATION METHOD THEREOF

(71) Applicant: WUHAN CHINA STAR OPTOELECTRONICS SEMICONDUCTOR DISPLAY TECHNOLOGY CO., LTD., Hubei (CN)

(72) Inventor: Sisi Zhou, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 172 days.

(21) Appl. No.: 16/966,145

(22) PCT Filed: Apr. 2, 2020

(86) PCT No.: PCT/CN2020/082993
§ 371 (c)(1),
(2) Date: Jul. 30, 2020

(87) PCT Pub. No.: WO2021/164106
PCT Pub. Date: Aug. 26, 2021

(65) Prior Publication Data
US 2021/0257588 A1  Aug. 19, 2021

(30) Foreign Application Priority Data
Feb. 18, 2020 (CN) .......... 202010099021.9

(51) Int. Cl.
*H01L 51/52* (2006.01)
*H01L 51/56* (2006.01)
*H01L 27/32* (2006.01)

(52) U.S. Cl.
CPC ...... *H01L 51/5253* (2013.01); *H01L 27/3276* (2013.01); *H01L 51/56* (2013.01); *H01L 2251/5338* (2013.01)

(58) Field of Classification Search
None
See application file for complete search history.

(56) References Cited

U.S. PATENT DOCUMENTS

2009/0108740 A1* 4/2009 Kim .............. H01L 51/5246
 313/504
2017/0294501 A1* 10/2017 Jang ............... H04R 1/345
(Continued)

FOREIGN PATENT DOCUMENTS

CN  107180848 A  9/2017
CN  109003998 A  12/2018
(Continued)

*Primary Examiner* — J. E. Schoenholtz
(74) *Attorney, Agent, or Firm* — Mark M. Friedman

(57) ABSTRACT

The present application discloses a flexible display panel and a method for manufacturing the same. By covering the edge of the metal film layer by using an organic protective layer at the groove of the planarization layer on the patterned metal film layer, which avoids subsequent etching of the anode etching solution of the organic light-emitting layer to the metal film layer, and prevents the metal at an edge of the metal film layer from being corroded, and can block moisture, oxygen and impurities in the air from entering a device area of the organic light-emitting layer along the edge of the metal film layer, thereby improving a packaging effect.

20 Claims, 3 Drawing Sheets

(56) References Cited

U.S. PATENT DOCUMENTS

| | | | | |
|---|---|---|---|---|
| 2019/0140042 A1* | 5/2019 | Zhang | ................ | H01L 51/5237 |
| 2019/0189718 A1 | 6/2019 | Lee | | |
| 2020/0066826 A1* | 2/2020 | Kim | ................ | H01L 51/5206 |
| 2020/0168684 A1* | 5/2020 | Kim | ................ | H01L 51/5218 |
| 2021/0134921 A1* | 5/2021 | Zeng | ................ | H01L 27/3276 |
| 2021/0351263 A1* | 11/2021 | Okabe | ................ | H05B 33/22 |
| 2022/0005911 A1* | 1/2022 | Zhou | ................ | H01L 27/3276 |
| 2022/0020958 A1* | 1/2022 | Okabe | ................ | G09F 9/00 |

FOREIGN PATENT DOCUMENTS

| | | |
|---|---|---|
| CN | 109659343 A | 4/2019 |
| CN | 109802052 A | 5/2019 |
| CN | 110459583 A | 11/2019 |
| JP | 2019125551 A | 7/2019 |

* cited by examiner

FLEXIBLE DISPLAY PANEL AND PREPARATION METHOD THEREOF

BACKGROUND OF INVENTION

Field of Invention

The present application relates to the field of display technology, and particularly, to a flexible display panel and preparation method thereof.

Description of Prior Art

With the rapid development of organic light emitting diodes (organic light emitting diodes, OLEDs for short) display technology, which promotes the rapid entry of curved and flexible display products into the market, technology updates in related fields are also changing rapidly. OLED devices are diode devices that use organic light-emitting materials to drive light through electric field injection through carrier injection and recombination. The OLED devices have received extensive attention because of their advantages such as light weight, thin thickness, bendability, and wide viewing angle range.

Please refer to FIGS. 1A-1B, wherein FIG. 1A is a schematic cross-sectional view of a conventional OLED display panel, and FIG. 1B is a schematic cross-sectional view of a metal film layer of the OLED display panel shown in FIG. 1A. The OLED display panel has a display area (Active Area, AA for short) 101 and a non-display area 102 surrounding the display area 101. The OLED display panel comprises: a substrate 11; a display unit 12 formed on the substrate 11 and corresponding to the display area 101; a patterned metal film layer 13 formed on the substrate 11 and corresponding to the non-display area 102; a barrier wall (DAM) unit 14 formed in the non-display area 102 and having at least a portion in contact with the metal film layer 13; and a thin film encapsulation layer (TFE) 15 for sealing the display unit 12.

The display unit 12 comprises a thin film transistor (TFT) layer 121, an OLED 122 electrically connected to the thin film transistor layer 121, and a planarization layer (PLN) 123 disposed between the thin film transistor layer 121 and the OLED 122. The OLED 122 comprises an anode (ANO) 1221, an intermediate layer 1222 containing organic light emitting materials, a cathode (Cathode) 1223, and a pixel definition layer (PDL) 1224. Wherein the anode 1221 is formed on the planarization layer 123 and is electrically connected to the thin film transistor layer 121 via a contact hole formed in the planarization layer 123. The pixel definition layer 1224 is formed on the planarization layer 123 and comprises an opening partially exposing the anode 1221.

The metal film layer 13 comprises a power line, and the power line is used to supply power to the OLED 122. The metal film layer 13 generally adopts a Ti/Al/Ti metal stacked structure, and is in the same layer with source/drain electrodes (S/D) of the thin film transistor layer 121. The planarization layer 123 above the metal film layer 13 on both sides of the retaining wall unit 14 is excavated to form a groove 13a, as shown in FIG. 1B. Wherein a part of the metal film layer 13 covered by the planarization layer 123 is indicated with a perspective effect.

The planarization layer 123 above the metal film layer 13 on both sides of the retaining wall unit 14 is excavated, and at least a portion of the retaining wall unit 14 may be formed to contact the metal film layer 13. FIG. 1A shows a retaining wall unit 14 comprising a first retaining wall 141 and a second retaining wall 142, wherein the first retaining wall 141 contacts the metal film layer 13.

The thin film encapsulation layer 15 can seal the display unit 12 and prevent external oxygen and moisture from penetrating into the display unit 12. FIG. 1A shows a thin-film encapsulation layer 15 including one organic layer 151 and two inorganic layers 152.

Since the metal film layer 13 generally adopts a Ti/Al/Ti metal stacked structure, and the planarization layer 123 in the groove 13a is excavated, exposing the edge of the metal film layer 13, in the subsequent When the anode 1221 forming the OLED 122 is etched, the etchant will penetrate along the edge of the metal film layer 13, causing Al in the Ti/Al/Ti metal stacked structure to be etched, so that the metal film layer 13 A cavity is formed in the middle, which causes the metal of the metal film layer 13 to be corroded, and water vapor, oxygen, impurities, etc. in the air will enter the device region of the OLED 122 along the cavity of the metal film layer 13 to affect the packaging effect.

SUMMARY OF INVENTION

The purpose of the present application is to provide a flexible display panel and a preparation method thereof in view of the problems in the prior art, which can avoid corrosion of the metal comprising the metal film layer of the power line and improve the packaging effect.

In order to achieve the above purpose, the present application provides a flexible display panel, having a display area and a non-display area surrounding the display area, wherein the flexible display panel comprises: a substrate; a thin film transistor layer formed on the substrate and corresponding to the display area, wherein the thin film transistor layer comprises at least one thin film transistor, and the thin film transistor comprises source/drain electrodes; a patterned metal film layer formed on the substrate and corresponding to the non-display area, wherein the metal film layer is in a same layer with the source/drain electrodes; at least one planarization layer formed on a side of the thin film transistor layer away from the substrate; a groove formed on the planarization layer and corresponding to an area of the metal film layer; and an organic protective layer formed in the groove and extending in a direction to the metal film layer, wherein the organic protective layer covers an edge of the metal film layer, wherein the organic protective layer and the planarization layer are in a same layer and are made of a same organic material, and the organic protective layer extends from the edge of the metal film layer toward a direction to an inside of the metal film layer by at least 1 um.

In order to achieve the above purpose, the present application further provides a flexible display panel, having a display area and a non-display area surrounding the display area, wherein the flexible display panel comprises: a substrate; a thin film transistor layer formed on the substrate and corresponding to the display area; a patterned metal film layer formed on the substrate and corresponding to the non-display area, wherein the metal film layer is in a same layer with the source/drain electrodes; at least one planarization layer formed on a side of the thin film transistor layer away from the substrate; a groove formed on the planarization layer and corresponding to an area of the metal film layer; and an organic protective layer formed in the groove and extending in a direction to the metal film layer, wherein the organic protective layer covers an edge of the metal film layer.

In order to achieve the above purpose, the present application further provides a preparation method of a flexible display panel, wherein the flexible display panel has a display area and a non-display area surrounding the display area; the method comprises the following steps: providing a substrate; preparing a thin film transistor layer and a patterned metal film layer on one side of the substrate, and wherein the thin film transistor layer corresponds to the display area, and the metal film layer corresponds to the non-display area; preparing at least one planarization layer on a side of the thin film transistor layer away from the substrate; and forming a groove on the planarization layer corresponding to the metal film layer area, and preparing an organic protective layer in the groove, and wherein the organic protective layer extends toward the metal film layer and covers the edge of the metal film layer.

The present application covers the edge of the metal film layer by using an organic protective layer at the groove of the planarization layer on the metal film layer comprising the power line, which avoids subsequent etching of the anode etching solution of the organic light-emitting layer to the metal film layer, and prevents the metal at an edge of the metal film layer from being corroded, and can block moisture, oxygen and impurities in the air from entering a device area of the organic light-emitting layer along the edge of the metal film layer, thereby improving a packaging effect.

BRIEF DESCRIPTION OF DRAWINGS

In order to more clearly explain the technical solutions in the embodiments of the present application, the following will briefly introduce the drawings required in the description of the embodiments. Obviously, the drawings in the following description are only some embodiments of the present application. For those skilled in the art, without paying any creative work, other drawings can be obtained based on these drawings.

DETAILED DESCRIPTION OF PREFERRED EMBODIMENTS

The flexible display panel of the present application. covers the edge of the metal film layer by using an organic protective layer at the groove of the planarization (PLN) layer on the metal film layer comprising the power line, which avoids the subsequent etching of the anode (ANO) etching solution of the organic light-emitting layer to the metal film layer, and prevents the metal at the edge of the metal film layer from being corroded, and can block moisture, oxygen and impurities in the air from entering the device area of the organic light-emitting layer along the edge of the metal film layer, thereby improving the packaging effect. Wherein the organic protective layer extends from the edge of the metal film layer to the inner side of the metal film layer by at least 1 um, so as to fully cover the edge of the metal film layer.

Figure 1A:
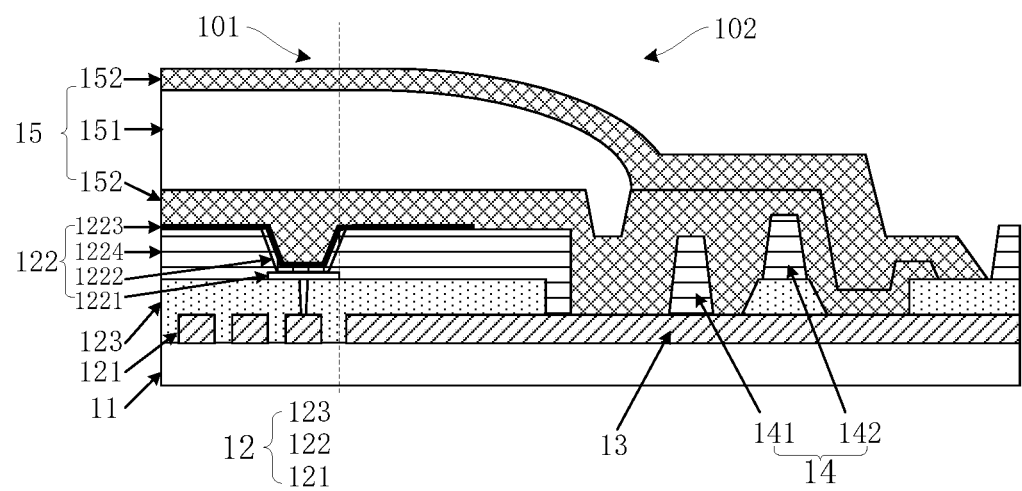
FIG. 1A is a schematic cross-sectional view of an existing OLED display panel.
Figure 1B:
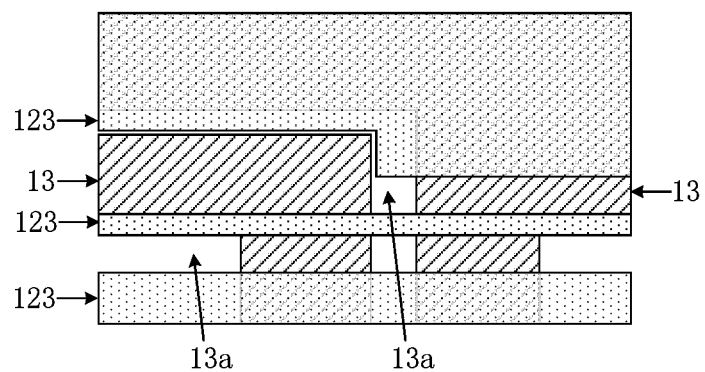
FIG. 1B is a schematic cross-sectional view of the metal film layer of the OLED display panel shown in FIG. 1A.
Figure 2:
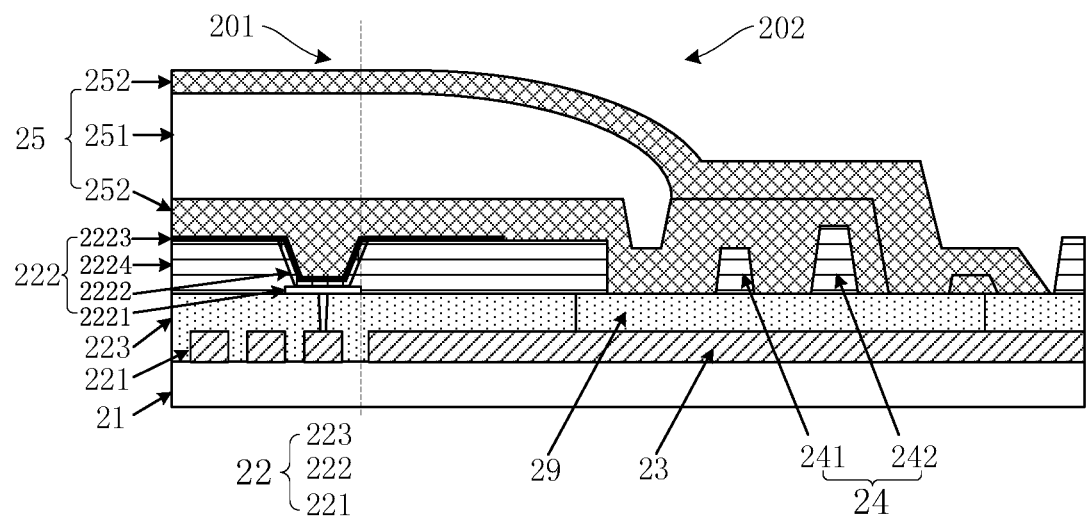
FIG. 2 is a schematic cross-sectional view of a flexible display panel of this application.
Figure 3A:
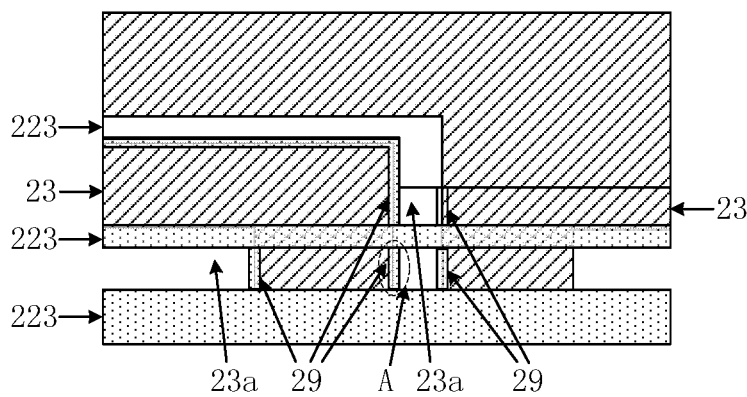
FIG. 3A is a schematic cross-sectional view of the metal film layer of the flexible display panel shown in FIG. 2.
Figure 3B:
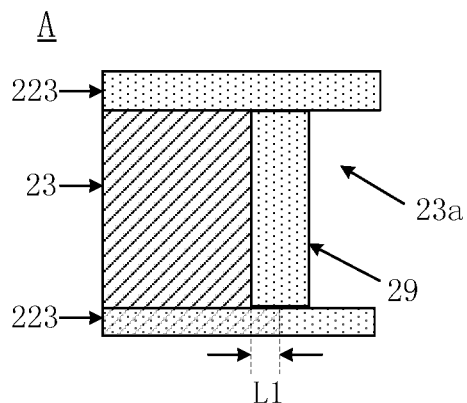
FIG. 3B is a enlarged schematic view of area A in FIG. 3A.

Please refer to FIG. 2 together, FIGS. 3A-3B, wherein FIG. 2 is a schematic cross-sectional view of the flexible display panel of the present application, FIG. 3A is a schematic cross-sectional view of the metal film layer of the flexible display panel shown in FIG. 2, and FIG. 3B is a enlarged schematic view of area A in FIG. 3A.

As shown in FIG. 2, the flexible display panel has a display area (Active Area, AA for short) 201 and a non-display area 202 surrounding the display area 201; the flexible display panel comprises: a substrate 21; a thin film transistor (TFT) layer 221 formed on the substrate 21 and corresponding to the display area 201; a patterned metal film layer 23 formed on the substrate 21 and corresponding to the non-display area 202, a planarization layer (PLN) 223 formed on a side of the thin film transistor layer 221 away from the substrate 21; an organic protective layer 29 formed in the groove 23a and extending toward the metal film layer 23, the organic protective layer 29 covers the edge of the metal film layer 23.

The substrate 21 may use insulating organic material such as transparent glass material or transparent plastic material, but it is not limited to this.

In a further embodiment, the flexible display panel further comprises an organic light emitting layer 222 formed on a side of the planarization layer 223 away from the thin film transistor layer 221 and electrically connected to the thin film transistor layer 221. The thin film transistor layer 221, the organic light emitting layer 222, and the planarization layer 223 disposed between the thin film transistor layer 221 and the organic light emitting layer 222 constitute the display unit 22. The thin film transistor layer 221 is a driving circuit of the flexible display panel and is an important part of the display panel; the planarization layer 223 mainly plays a role of smoothing the in-plane step difference caused by various layer patterns on the thin film transistor layer 221, as well as isolating the thin film transistor layer 221 from the organic light emitting layer 222 and preventing electric field interference.

In a further embodiment, the thin film transistor layer 221 comprises at least one thin film transistor, and the thin film transistor comprises source/drain electrodes (S/D); the metal film layer 23 comprises a power line, wherein the power line and the source/drain electrodes are formed on the same layer. The metal film layer 23 generally adopts a Ti/Al/Ti metal stack structure. The metal film layer 23 may be in the same layer as the source/drain electrodes and prepared by the same patterning process. It should be noted that the thin film transistor further comprises an active layer, a gate electrode, an interlayer insulating layer, etc. However, the improvement of the present application does not involve these components, so it is not shown in FIG. 2 and will not be repeated here repeat.

In a further embodiment, the organic protective layer 29 and the planarization layer 223 are formed on the same layer. Specifically, the planarization layer 223 forms the groove 23a in the area corresponding to the metal film layer 23, and the organic protective layer 29 is formed in the groove 23a and extends toward the metal film layer 23, as shown in FIG. 3A, a portion of the metal film layer 23 covered by the planarization layer 123 and the organic protective layer 29 is illustrated with a perspective effect.

The organic protective layer 29 and the planarization layer 223 can be made of the same organic material and prepared by the same patterning process. For example, an organic material is deposited and patterned on the thin film transistor layer 221 and the metal film layer 23 to form the planarization layer 223, and a groove 23a is formed on the formed planarization layer 223 corresponding to the area of the metal film layer 23, and at the same time, a portion of the organic material remaining in the groove 23a forms the organic protective layer 29 extending from the groove 23a toward the metal film layer 23 to cover the edge of the metal film layer. In this embodiment, there is only one planarization layer 223 above the metal film layer 23, and the planarization layer 223 is dug in the groove 23a. It should be noted that, in other embodiments, the metal film layer 23 may have two or more planarization layers above it. When there are two planarization layers on the metal film layer 23, the edge of the metal film layer 23 may be covered with an organic protective layer formed by patterning the first planarization layer (that is, the organic material partially retained in the groove 23a is the organic material corresponding to the first planarization layer), or it can also be covered with an organic protective layer formed by patterning the second planarization layer (that is, the organic material partially retained in the groove 23a is the organic material corresponding to the second planarization layer).

Preferably, the organic protective layer 29 extends from the edge of the metal film layer 23 toward the inside of the metal film layer 23 by at least 1 um. That is, in a top view, the width L1 of the organic protective layer 29 covering the edge of the metal film layer 23 is greater than 1 um, thereby fully covering the edge of the metal film layer 23, as shown in FIG. 3B.

Please continue to refer to FIG. 2. In this embodiment, the organic light-emitting layer 222 comprises an anode (ANO) 2221, an intermediate layer 2222 containing an organic light-emitting material, a cathode (Cathode) 2223 and a pixel definition layer (PDL) 2224. Wherein, the anode 2221 is formed on the planarization layer 223, and is electrically connected to the thin film transistor layer 221 via a contact hole formed in the planarization layer 223. The pixel definition layer 2224 is formed on the planarization layer 223 and comprises an opening partially exposing the anode 2221, the pixel definition layer 2224 is used to define a pixel area and a non-pixel area, and the pixel definition layer 2224 is also dug in the groove 23a. The light-emitting material used in the intermediate layer 2222 may be an OLED light-emitting material. Correspondingly, the flexible display panel is an OLED flexible display panel; the light-emitting material used in the intermediate layer 2222 may also be a quantum dot light-emitting material. This application does not limit the specific setting form of luminescent materials.

In a further embodiment, the metal film layer 23 may comprises a driving power line (ELVDD) and a common power line (ELVSS). The common power line may be connected to the cathode 2223 of the organic light-emitting layer 222 for powering the organic light-emitting layer 222.

In a further embodiment, the flexible display panel further comprises a retaining wall (DAM) unit 24 formed in the groove 23a and having at least a portion in contact with the metal film layer 23, and the organic protective layer 29 is formed on both sides of the retaining wall unit 24. In this embodiment, on the metal film layer 23, the planarization layer 223 and the pixel definition layer 2224 on both sides of the retaining unit 24 are excavated to form the groove 23a. The retaining wall unit 24 comprises a first retaining wall 241 and a second retaining wall 242 spaced apart from each other, wherein the first retaining wall 241 is formed directly on the metal film layer 23 and surrounds the display area 201, so as to be in contact with the metal film layer 23; the second retaining wall 242 is formed on the same film layer as the planarization layer 223 (which may be a film layer formed of an organic material remaining when forming the groove 23a) and surrounds the first retaining wall 241, so that the height of the second retaining wall 242 is higher than that of the first retaining wall 241, and the second retaining wall 242 is not in contact with the metal film layer 23.

In a further embodiment, the retaining wall unit 24 is in the same layer as the pixel definition layer 2224 used to define the pixel area. Preferably, both are made of the same material and prepared by the same patterning process. For example, they are made of the same organic material and the same photomask, and are prepared by processes such as exposure and development. It should be noted that this application does not limit the number of retaining walls (Dam) in the retaining wall unit 24, and may be one, two or more.

In a further embodiment, the flexible display panel further comprises: a thin film encapsulation layer (TFE) 25 formed on a side of the organic light emitting layer 222 away from the planarization layer 223, the thin film encapsulation layer 25 is used to seal the display unit 22.

In this embodiment, the thin film encapsulation layer 25 comprises an organic layer 251 and two inorganic layers 252, wherein the organic layer 251 covers the display area 201 and extends to the retaining wall unit 24, and the two inorganic layers 252 extend outside the retaining wall unit 24 and contact each other. The thin film encapsulation layer 25 can seal the display unit 22 and prevent external oxygen and moisture from penetrating into the display unit 22. In other embodiments, the thin film encapsulation layer 25 may comprises multiple organic layers and multiple inorganic layers, and the organic layers and the inorganic layers may be alternately stacked to form a multilayer structure. The organic layer 251 mainly functions to flatten the surface of the panel and coat the contaminating particles. The organic layer 251 may be prepared by an inkjet printing (Inkjet Printing, IJP) process. It can be understood that the material used for the organic layer 251 is a material for buffering the stress of the device during bending and folding and covering with particulate contaminants. It can be understood that, in some embodiments, there may be no contamination particles. The main function of the two inorganic layers 252 is to isolate water and oxygen to prevent water vapor or oxygen from invading the organic light-emitting layer (especially the intermediate layer 2222 containing the organic light-emitting material) and the light emission becomes dark. The inorganic layer 252 can be prepared by using a chemical vapor deposition (Chemical Vapor Deposition, CVD for short) process. It can be understood that the material used for the inorganic layer 252 is an inorganic material that can increase the water and oxygen resistance of the device.

In a further embodiment, the retaining wall unit 24 may continuously surround the display area 201 in a ring shape to prevent the organic material of the organic layer 251 of the thin film encapsulation layer 25 from flowing along the edge of the substrate 21. When only one retaining wall is provided, the flow of the organic material of the organic layer 251 can be prevented. When two or more retaining walls are provided, the organic material of the organic layer 251 can be prevented from diffusing and overflowing, and the backflow of the organic material can be effectively prevented.

The flexible display panel of the present application covers the edge of the metal film layer by using an organic protective layer at the groove of the planarization layer on the metal film layer, which avoids subsequent etching of the anode (ANO) etching solution of the organic light-emitting layer to the metal film layer, and prevents the metal at an edge of the metal film layer from being corroded, and can block moisture, oxygen and impurities in the air from entering a device area of the organic light-emitting layer along the edge of the metal film layer, thereby improving a packaging effect.

Figure 4:
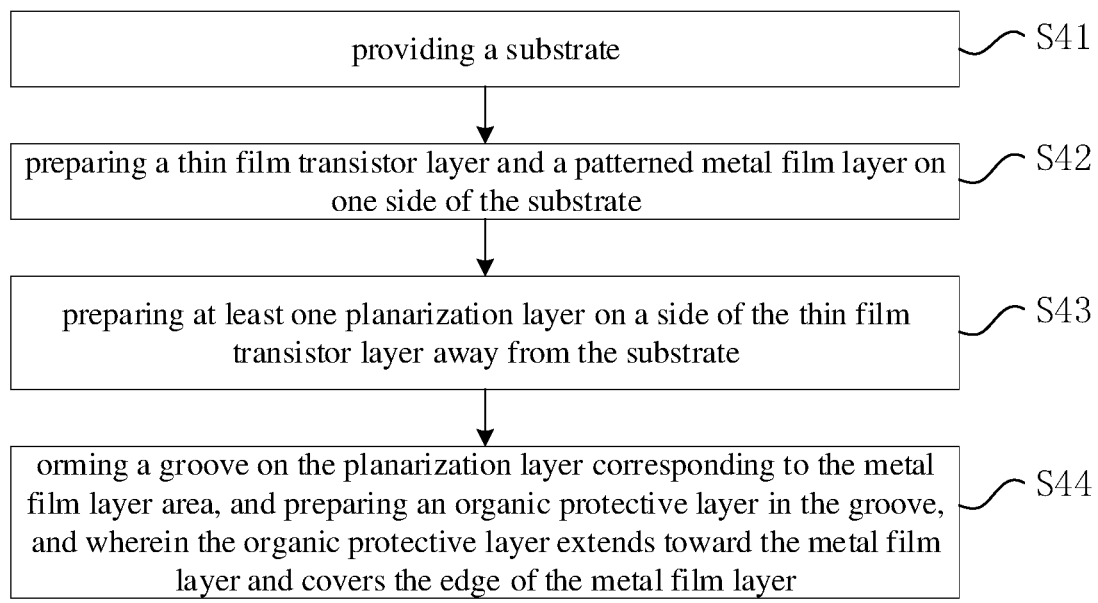
FIG. 4 is a schematic flowchart of a preparation method of a flexible display panel of the present application.

Based on the same inventive concept, the present application also provides a preparation method of a flexible display panel. Please refer to FIG. 4, which is a schematic flowchart of a preparation method of a flexible display panel of the present application. The flexible display panel of the present application has a display area and a non-display area surrounding the display area; the preparation method of the flexible display panel specifically comprises the following steps: S41: providing a substrate; S42: preparing a thin film transistor layer and a patterned metal film layer on one side of the substrate, and wherein the thin film transistor layer corresponds to the display area, and the metal film layer corresponds to the non-display area (that is, the thin film transistor layer is formed on the substrate The area corresponding to the display area, the metal film layer is formed on the substrate corresponding to the non-display area); S43: preparing at least one planarization layer on a side of the thin film transistor layer away from the substrate; S44: forming a groove on the planarization layer corresponding to the metal film layer area, and preparing an organic protective layer in the groove, and wherein the organic protective layer extends toward the metal film layer and covers the edge of the metal film layer. For the film structure and preparation process of the thin film transistor layer, reference may be made to the prior art, which will not be repeated here.

In a further embodiment, the thin film transistor layer comprises at least one thin film transistor, and the thin film transistor comprises source/drain electrodes; the metal film layer comprises power lines, wherein the power lines are formed with the source/drain electrodes On the same floor. The metal film layer generally adopts a Ti/Al/Ti metal stacked structure. The metal film layer may be in the same layer as the source/drain electrodes and prepared by the same patterning process.

In a further embodiment, step S44 further comprises: patterning the planarization layer (for example, digging a groove in the region corresponding to the metal film layer) to form a groove in the area corresponding to the metal film layer and partially retaining an organic material of a planarization layer, forming a groove extending from the groove toward the metal film layer and covering the organic protective layer on the edge of metal film layer.

When there is only one planarization layer on the metal film layer, the organic protective layer and the planarization layer may use the same organic material and be prepared by the same patterning process. Specifically, an organic material is deposited and patterned on the thin film transistor layer and the metal film layer to form the planarization layer, and a groove is formed on the formed planarization layer corresponding to the metal film layer area; meanwhile, the organic material partially retained in the groove forms the organic protective layer extending from the groove toward the metal film layer to cover the edge of the metal film layer, as shown in FIG. 3A.

When there are two or more planarization layers planarization layer on the metal film layer, the organic protective layer may use the same organic material as any planarization layers and be prepared by the same patterning process. Specifically, a first organic material is deposited and patterned on the thin film transistor layer and the metal film layer to form a first planarization layer, and a groove is formed on the formed first planarization layer corresponding to the metal film layer area. At the same time, the first organic material partially retained in the groove forms the organic protective layer extending from the groove toward the metal film layer to cover the edge of the metal film layer (that is, the edge of the metal film layer is covered with an organic protective layer formed by patterning the first planarization layer); then a second organic material is deposited and patterned to form a second planarization layer, and the formed second planarization layer is completely dug out corresponding to the groove. Alternatively, a first organic material is deposited and patterned on the thin film transistor layer and the metal film layer to form a first planarization layer, and a groove is formed on the formed first planarization layer corresponding to the metal film layer area, all the first organic materials in the groove are dug out; then, a second organic material is deposited and patterned to form a second planarization layer, the formed second planarization layer is dug out corresponding to the groove, and at the same time, the second organic material partially retained in the groove, forming the organic protective layer extending from the groove toward the metal film layer to cover the edge of the metal film layer (that is, the edge of the metal film layer is formed with a patterned second planarization layer Organic protective layer cover).

In a further embodiment, the organic protective layer extends from the edge of the metal film layer toward the inside of the metal film layer by at least 1 um. That is, in a top view, the width of the organic protective layer covering the edge of the metal film layer is greater than 1 um, thereby fully covering the edge of the metal film layer, as shown in FIG. 3B.

In a further embodiment, the preparation method of the flexible display panel of the present application further comprises: preparing a retaining wall unit in the groove, at least a portion of the retaining wall unit contacts the metal film layer, wherein the organic protective layer formed on both sides of the retaining wall unit. In a further embodiment, the retaining wall unit may comprise a first retaining wall and a second retaining wall spaced apart from each other, wherein the first retaining wall is formed directly on the metal film layer and surrounds the display area so as to be in contact with the metal film layer; the second retaining wall is formed on the same film layer as the material of the planarization layer and surrounds the first retaining wall, thereby making the height of the second retaining wall high at the height of the first retaining wall, and the second retaining wall is not in contact with the metal film layer.

In a further embodiment, the retaining unit is at the same layer as the pixel definition layer used to define the pixel area. Preferably, both are made of the same material and prepared by the same patterning process. For example, they are made of the same organic material and the same photomask, and are prepared by processes such as exposure and development. It should be noted that this application does not limit the number of retaining walls (Dam) in the retaining wall unit, and may be one, two or more.

In a further embodiment, the preparation method of the flexible display panel of the present application further comprises: preparing an organic light-emitting layer on a side of the thin-film transistor layer away from the substrate, and preparing a thin film encapsulation layer on one side of the organic light-emitting layer away from the thin-film transistor layer, wherein the organic light-emitting layer corresponds to the display area, and the thin-film encapsulation layer corresponds to the display area and the non-display area. The film structure and preparation process of the organic light-emitting layer and the thin-film encapsulation layer can refer to the prior art, and will not be repeated here.

The present application covers the edge of the metal film layer by using an organic protective layer at the groove of the planarization layer on the metal film layer, which avoids subsequent etching of the anode etching solution of the organic light-emitting layer to the metal film layer, and prevents the metal at an edge of the metal film layer from being corroded, and can block moisture, oxygen and impurities in the air from entering a device area of the organic light-emitting layer along the edge of the metal film layer, thereby improving a packaging effect.

It can be understood that for those of ordinary skill in the art, equivalent replacements or changes can be made according to the technical solutions and inventive concepts of the present application, and all such changes or replacements should fall within the protection scope of the claims appended to the present application.

What is claimed is:

1. A flexible display panel, having a display area and a non-display area surrounding the display area, wherein the flexible display panel comprises:
   a substrate;
   a thin film transistor layer formed on the substrate and corresponding to the display area, wherein the thin film transistor layer comprises at least one thin film transistor, and the thin film transistor comprises source/drain electrodes;
   a patterned metal film layer formed on the substrate and corresponding to the non-display area, wherein the patterned metal film layer is in a same layer with the source/drain electrodes;
   at least one planarization layer formed on a side of the thin film transistor layer away from the substrate;
   a groove formed on the planarization layer and corresponding to an area of the patterned metal film layer; and
   an organic protective layer formed in the groove and extending in a direction to the patterned metal film layer, wherein the organic protective layer covers an edge of the patterned metal film layer, wherein the organic protective layer and the planarization layer are in a same layer and are made of a same organic material, and the organic protective layer extends from the edge of the patterned metal film layer toward a direction to an inside of the patterned metal film layer by at least one micron.

2. The flexible display panel of claim 1, wherein the patterned metal film layer comprises a power line, and wherein the power line and the source/drain electrodes are formed on the same layer.

3. The flexible display panel of claim 1, wherein the flexible display panel further comprises:
   an organic light emitting layer formed on a side of the planarization layer away from the thin film transistor layer and electrically connected to the thin film transistor layer; and
   a thin-film encapsulation layer formed on a side of the organic light-emitting layer away from the planarization layer.

4. The flexible display panel of claim 1, wherein the flexible display panel further comprises a retaining wall unit formed in the groove and having at least a portion contacting the patterned metal film layer, and the organic protective layer is formed on both sides of the retaining wall unit.

5. The flexible display panel of claim 4, wherein the retaining wall unit continuously surrounds the display area in a ring shape.

6. A flexible display panel, having a display area and a non-display area surrounding the display area, wherein the flexible display panel comprises:
   a substrate;
   a thin film transistor layer formed on the substrate and corresponding to the display area;
   a patterned metal film layer formed on the substrate and corresponding to the non-display area, wherein the patterned metal film layer is in a same layer with the source/drain electrodes;
   at least one planarization layer formed on a side of the thin film transistor layer away from the substrate;
   a groove formed on the planarization layer and corresponding to an area of the patterned metal film layer; and
   an organic protective layer formed in the groove and extending in a direction to the patterned metal film layer, wherein the organic protective layer covers an edge of the metal film layer.

7. The flexible display panel of claim 6, wherein the thin film transistor layer comprises at least one thin film transistor, and the thin film transistor comprises source/drain electrodes; the patterned metal film layer comprises a power line, and wherein the power line and the source/drain electrodes are formed on the same layer.

8. The flexible display panel of claim 6, wherein the organic protective layer extends from the edge of the patterned metal film layer toward a direction to an inside of the patterned metal film layer by at least one micron.

9. The flexible display panel of claim 6, wherein the flexible display panel comprises a planarization layer, the organic protective layer and the planarization layer are in a same layer and are made of a same organic material.

10. The flexible display panel of claim 6, wherein the flexible display panel comprises multiple planarization layers, the organic protective layer and the planarization layer are in a same layer and are made of a same organic material.

11. The flexible display panel of claim 6, wherein the flexible display panel further comprises:
    an organic light emitting layer formed on a side of the planarization layer away from the thin film transistor layer and electrically connected to the thin film transistor layer; and
    a thin-film encapsulation layer formed on a side of the organic light-emitting layer away from the planarization layer.

12. The flexible display panel of claim 6, wherein the flexible display panel further comprises a retaining wall unit formed in the groove and having at least a portion contacting the patterned metal film layer, and the organic protective layer is formed on both sides of the retaining wall unit.

13. The flexible display panel of claim 12, wherein the retaining wall unit continuously surrounds the display area in a ring shape.

14. A preparation method of a flexible display panel, wherein the flexible display panel has a display area and a non-display area surrounding the display area; the method comprises the following steps:
    providing a substrate;

preparing a thin film transistor layer and a patterned metal film layer on one side of the substrate, and wherein the thin film transistor layer corresponds to the display area, and the patterned metal film layer corresponds to the non-display area;

preparing at least one planarization layer on a side of the thin film transistor layer away from the substrate; and forming a groove on the planarization layer corresponding to the patterned metal film layer area, and preparing an organic protective layer in the groove, and wherein the organic protective layer extends toward the patterned metal film layer and covers the edge of the patterned metal film layer.

15. The preparation method of claim 14, wherein the thin film transistor layer comprises at least one thin film transistor, and the thin film transistor comprises source/drain electrodes; the patterned metal film layer comprises a power line, and wherein the power line and the source/drain electrodes are formed on the same layer.

16. The preparation method of claim 14, wherein the flexible display panel comprises a single-layer planarization layer formed of an organic material, and the step of forming a groove on the planarization layer corresponding to the patterned metal film layer area, and preparing an organic protective layer in the groove further comprises: patterning the planarization layer to form the groove in an area corresponding to the patterned metal film layer; and at the same time, partially retaining the organic material of the planarization layer to form the organic protective layer, wherein the organic protective layer extends toward the patterned metal film layer and covers the edge of the patterned metal film layer.

17. The preparation method of claim 14, wherein the flexible display panel comprises multiple planarization layers formed of an organic material, and the step of forming a groove on the planarization layer corresponding to the patterned metal film layer area, and preparing an organic protective layer in the groove further comprises: patterning the planarization layer to form the groove in an area corresponding to the patterned metal film layer; and at the same time, partially retaining the organic material of the planarization layer to form the organic protective layer, wherein the organic protective layer extends toward the patterned metal film layer and covers the edge of the patterned metal film layer.

18. The preparation method of claim 14, wherein the organic protective layer extends from the edge of the patterned metal film layer toward the inside of the patterned metal film layer by at least one micron.

19. The preparation method of claim 14, wherein the preparation method also comprises:

a retaining wall unit is prepared in the groove, at least a portion of the retaining wall unit contacts the patterned metal film layer, and wherein the organic protective layer is formed on both sides of the retaining wall unit.

20. The preparation method of claim 14, wherein the preparation method also comprises:

preparing an organic light emitting layer on a side of the thin film transistor layer away from the substrate, wherein the organic light emitting layer corresponds to the display area; and preparing a thin-film encapsulation layer on a side of the organic light-emitting layer away from the thin-film transistor layer, wherein the thin-film encapsulation layer corresponds to the display area and the non-display area.

* * * * *